United States Patent
Tetsuka et al.

(10) Patent No.: US 6,884,660 B2
(45) Date of Patent: Apr. 26, 2005

(54) THERMOCONDUCTING SILICONE COMPOSITION, ITS CURING PRODUCT AND INSTALLATION METHOD, AND A HEAT DISSIPATING STRUCTURE OF A SEMICONDUCTOR DEVICE USING SAME

(75) Inventors: Hiroaki Tetsuka, Gunma (JP); Kunihiro Yamada, Gunma (JP); Kunihiko Mita, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 139 days.

(21) Appl. No.: 10/316,078

(22) Filed: Dec. 11, 2002

(65) Prior Publication Data

US 2003/0127496 A1 Jul. 10, 2003

(30) Foreign Application Priority Data

Dec. 11, 2001 (JP) ........................................ 2001-376844

(51) Int. Cl.[7] ........................ H01L 23/34; H01L 23/40; C08L 83/05; C08L 83/07
(52) U.S. Cl. ........................ 438/122; 524/860; 524/861; 524/862; 524/863; 524/866
(58) Field of Search ................................ 428/446, 447, 428/448, 450; 524/858, 860, 861, 862, 863, 866; 438/122

(56) References Cited

U.S. PATENT DOCUMENTS

| | | | | | |
|---|---|---|---|---|---|
| 5,021,494 A | * | 6/1991 | Toya | ........................... | 524/404 |
| 6,069,201 A | | 5/2000 | Kashiwagi et al. | | |
| 2003/0234074 A1 | * | 12/2003 | Bhagwagar | ................. | 156/325 |

FOREIGN PATENT DOCUMENTS

| | | |
|---|---|---|
| EP | 696630 A | 5/1997 |
| EP | 1254924 | 11/2002 |
| WO | WO 03067658 | 8/2003 |

OTHER PUBLICATIONS

JP '8053664, Patent Abstracts of Japan, filed Feb. 27, 1996, corresponding to EP 696630, May 14, 1997.
JP 6196884A, Patent Abstracts of Japan.
Patent Abstracts of Japan, Jan. 30, 1998, vol. 1998, No. 01, & Hitachi Powered Metals Co Ltd, JP 09227979 A, "Low thermal expansion sintered alloy," Sep. 2, 1997, abstract.

* cited by examiner

*Primary Examiner*—Michael J. Feely
(74) *Attorney, Agent, or Firm*—Millen White Zelano & Branigan, P.C.

(57) ABSTRACT

The present invention relates to a thermoconducting silicone composition having a viscosity at 25° C. before curing of 10–1,000 Pa·s, a method of installing the composition, and a heat dissipating structure comprising the silicone composition.

16 Claims, 1 Drawing Sheet

THERMOCONDUCTING SILICONE COMPOSITION, ITS CURING PRODUCT AND INSTALLATION METHOD, AND A HEAT DISSIPATING STRUCTURE OF A SEMICONDUCTOR DEVICE USING SAME

FIELD OF THE INVENTION

This invention relates to a thermoconducting silicone composition, and more particularly relates to a thermoconducting silicone composition with excellent thermoconducting properties after curing which is suitable for dissipating the heat from an IC package, to its installation method, and to a semiconductor device using the same.

BACKGROUND OF THE INVENTION

An IC package such as a CPU which is an electric component mounted on a printed circuit board, is liable to suffer decreased performance or damage due to the temperature rise occasioned by the heat emitted during use. In the prior art, a heat dissipating sheet or heat dissipating grease with good thermoconducting properties was used between the IC package and a heat dissipating fin. However, the increased performance of electronic components has led to more and more heat emission, so a substance with more powerful thermoconducting properties was desired.

Although the dissipating sheets of the prior art are easily mounted, as far as regards the ease of processing steps in their manufacture, there is a limit to the filler amount they can contain. Consequently, they had the disadvantage that sufficient thermoconducting properties could not be obtained. Heat dissipating grease on the other hand can follow and be in intimate contact with the surfaces of the CPU or heat dissipating fins without being affected by imperfections on the surface, but it soils other components, and oil flows out from it after long periods of use.

A method has been proposed wherein a liquid silicone rubber composition is used as a potting agent or adhesive, and another method has been proposed for curing and interposing a heat dissipating grease (Japanese Patent Application Public Disclosure Sho 61-157569, Japanese Patent Application Public Disclosure Hei 8-208993). However, as emphasis was given to ease of operation when the heat dissipating grease was applied, there was a limit to the blending amount of thermoconducting filler which was blended in order to impart thermoconducting properties. As a means of improving thermoconducting properties, a method has been proposed for melting and dispersing a low melting point metal or alloy which is a solid at ordinary temperature, in the silicone composition (Japanese Patent Application Public Disclosure Hei-7-207160, U.S. Pat. No. 5,445,308). However, as this crushed low melting point metal or alloy is melted in order to blend it, it lacks uniform dispersion properties so the thermoconducting silicone composition is non-homogeneous, and as the thermoconducting silicone composition contains powder of large particle diameter due to the low melting point metal, a thin film could not be applied.

The inventors carried out intensive studies in order to resolve the above problems. As a result, it was discovered that using a thermoconducting silicone composition as a filler, this composition being a combination of a low melting point metal powder which is a solid at ordinary temperature having a controlled particle size and a thermoconducting filler, imparted excellent heat dissipating properties. It was found that when the low melting point metal was blended and kneaded at a temperature below the melting point, the thermoconducting silicone composition was very homogeneous and had a high thermoconductivity. It was also found that the thermal resistance of the thermoconducting silicone composition could be very much lowered by transiently applying heat to raise the temperature above the melting point of the low melting point metal powder after curing.

It is therefore a first object of this invention to provide a thermoconducting silicone composition having excellent heat dissipating properties when used as a heat dissipating structure of a semiconductor device.

It is a second object of this invention to provide a thermoconducting silicone composition with thermoconducting properties improved by post-heating.

It is a third object of this invention to provide a method of introducing the aforesaid thermoconducting silicone composition between an IC package and a heat dissipating fin.It is a fourth object of this invention to provide a heat dissipating structure for a semiconductor device having excellent heat dissipating properties.

SUMMARY OF THE INVENTION

The aforesaid objects of the invention are attained by a thermoconducting silicone composition comprising the following components (A)–(F), whereof the viscosity at 25° C. before curing is 10–1000 Pa·s:

Component (A): 100 weight parts of an organopolysiloxane having at least two alkenyl groups in the molecule, and a viscosity of 10–100,000 mm$^2$/s at 25° C., Component (B): An organohydrogenpolysiloxane having at least two hydrogen atoms bonded directly to silicon atoms in the molecule, in an amount such that (total number of hydrogen atoms bonded directly to silicon atoms/total number of alkenyl groups in Component (A)) is 0.5–5.0, Component (C): A low melting metal powder having a melting point of 40–250° C., and an average particle size of 0.1–100 micrometers, Component (D): A highly thermoconducting filler having a melting point of more than 250° C., and an average particle size of 0.1–100 micrometers, the total amount of component (C) and Component (D) being 800–2,200 weight parts, and (C)/((C)+(D))=0.05–0.9, Component (E): A catalytic platinum selected from a group comprising platinum and platinum compounds, 0.1–500 ppm relative to Component (A) calculated in terms of platinum atom, Component (F): 0.001–5 weight parts of a controlling agent which suppresses the catalytic activity of Component (E).

In the present invention, it is more effective to use an additive which improves the wettability of the filler and silicone component. It is particularly effective if this additive is an organosilane (Component (G)) of the general formula (1):

$$R^1_a R^2_b Si(OR^3)_{4-a-b} \tag{1}$$

In the above formula, $R^1$ is an alkyl group having 6–15 carbon atoms, $R^2$ is a monovalent hydrocarbon group having 1–8 carbon atoms, and $R^3$ is an alkyl group having 1–6 carbon atoms, these groups being identical or different. Further, a is an integer in the range 1–3, b is an integer in the range 0–2, and a+b is an integer in the range 1–3.

In the present invention, it is still more effective to remove the oxide film present on the surface of the metal filler component, and additionally use a flux component (H) to improve the filler properties. It is particularly effective if the silicone composition employs an organic acid type or resin type flux in order to make use of use of addition reactions.

DETAILED DESCRIPTION OF THE INVENTION

Figure 1:
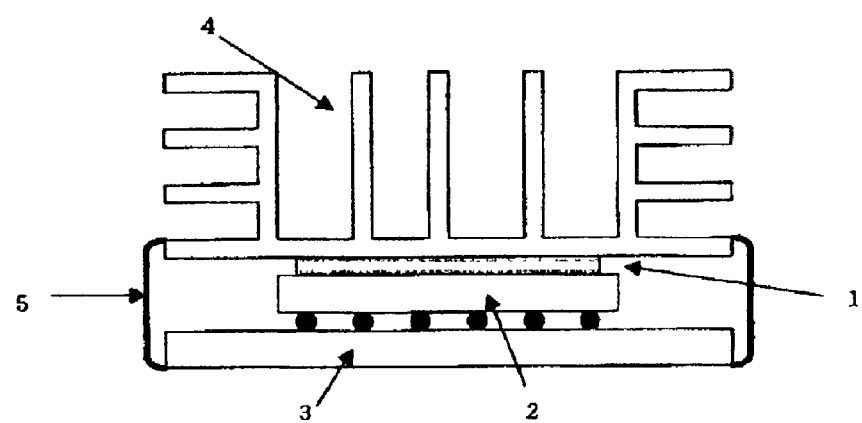
FIG. 1 is a transverse cross-sectional view of a heat dissipating body of a semiconductor device according to this invention, wherein symbol 1 is Thermoconducting silicone composition, 2 is IC package, e.g. of a central processing unit (CPU), 3 is Printed circuit board, 4 is Heat dissipating body and 5 is Clamp.

The organopolysiloxane which is the Component (A) of this invention, maybe straight chain or branched provided that it contains at least two alkenyl groups directly bonded to silicon atoms in the molecule. This organopolysiloxane may be of one type, or it may be a mixture of two or more types of different viscosities. Examples of the alkenyl group are vinyl, aryl, 1-butenyl and 1-hexenyl, but from the viewpoint of ease of synthesis and cost, vinyl is preferred. The other organic group bonded to silicon atoms may be an alkyl group such as methyl, ethyl, propyl, butyl, hexyl or dodecyl, an aryl group such as phenyl, an aralkyl group such as 2-phenylethyl and 2-phenylpropyl, or a substituted hydrocarbon group such as fluoromethyl or 3,3,3-trifluoropropyl.

Of these, from the viewpoint of ease of synthesis and cost, it is preferred that 90% or more is methyl. The alkyl group bonded to silicon atoms may be present at the end of or midway along the organopolysiloxane chain, but from the viewpoint of flexibility, it is preferred that it is present at both ends. As the storage stability of the composition is impaired if the viscosity at 25° C. is lower than 10 mm$^2$/s, and the extensibility of the composition is impaired if the viscosity exceeds 100,000 mm$^2$/s, the viscosity must be within the range 10–100,000 mm$^2$/s, but it is preferably within the range 100–50,000 mm$^2$/s.

The organohydrogenpolysiloxane comprising a hydrogen atom directly bonded to a silicon atom is used to give the composition a reticular structure by crosslinking, and it must therefore contain at least two hydrogen atoms directly bonded to silicon atoms in the molecule. The other organic group bonded to silicon atoms may be an alkyl group such as methyl, ethyl, propyl, butyl, hexyl or dodecyl, an aryl group such as phenyl, an aralkyl group such as 2-phenylethyl and 2-phenylpropyl, or a substituted hydrocarbon group such as fluoromethyl or 3,3,3-trifluoropropyl. Of these, from the viewpoint of ease of synthesis and cost, methyl is preferred. The organopolysiloxane having a hydrogen atom directly bonded to a silicon atom may be straight chain, branched or cyclic, or a mixture of these. Regarding the blending amount of Component (B), if the number of hydrogen atoms directly bonded to silicon atoms in Component (B) relative to the number of alkenyl groups in Component (A), i.e., if the ratio (total number of hydrogen atoms directly bonded to silicon atoms)/(total number of alkenyl groups in Component (A)), is less than 0.5, a sufficiently reticular structure cannot be obtained so the required hardness after curing is not obtained, whereas it is more than 5.0, there is a significant time-dependent change after curing, hence this ratio should be within the range 0.5–5.0, but it is preferably 1.0–3.0.

The low melting point metal powder which is Component (C) is used to impart thermoconducting properties to this invention. If the melting point of this low melting point metal powder is less than 40° C. handling is difficult, and if it were heated to more than 250° C., the printed circuit board which is to be mounted would be damaged. Consequently, it must be within the range of 40–250° C., but it is preferably 100–220° C.

If the average particle size of the low melting point powder is less than 0.1 micrometers, the viscosity of the composition obtained is too high so extensibility is poor, and if it is more than 100 micrometers, the composition obtained is non-homogeneous and a thin film cannot be coated. Therefore, its average particle size must be within the range 0.1–100 micrometers, and it is particularly preferred that it is 20–50 micrometers. The particles of this powder may be spherical or irregular.

The metal powder which is Component (C) may be a single metal such as indium or tin, or an alloy of various metals. Examples of alloys are malott's metal alloys of bismuth, lead, tin or antimony, ceromatrix alloys, solder, wood's metal or cerolo alloys of tin, lead, bismuth, indium, cadmium, zinc, silver or antimony, or aluminum solder comprising aluminum, zinc, tin, lead or cadmium (Basic Chemical Handbook, Revision 4): ed. Japan Chemical Society, 30 Sep. 1993, PI-547).

The filler, which is Component (D), also has the function of imparting thermoconducting properties to this invention. If the average particle size of the thermoconducting filler is less than 0.1 micrometers, the viscosity of the composition obtained is too high so extensibility is poor, and if it is more than 100 micrometers, the composition obtained is non-homogeneous. Therefore, its average particle size must be within the range 0.1–100 micrometers, and it is particularly preferred that it is within the range 1–20 micrometers.

The Components (C) and (D) are blended such that the total amount of (C) and (D) is 800–2,200 weight parts, and (C)/(C)+(D))=0.05–0.9. If the total amount of (C) and (D) is less than 800 weight parts, the thermoconductivity of the composition obtained is poor, and storage stability is poor. If it is more than 2200 weight parts, extensibility is poor which is undesirable. In this invention, it is preferred that the total amount is 1000–1,700 weight parts. If (C)/((C)+(D)) is less than 0.05, heat dissipation properties are poor, and if it is more than 0.9, storage stability is poor. It is therefore preferred that the proportion of the Component (C) contained in the total components (C) and (D) is 0.2–0.8.

There is no limitation on the filler which is Component (D) provided that its thermoconductivity is good and its melting point exceeds 250° C. Examples are aluminium powder, zinc oxide powder, alumina powder, boron nitride powder, aluminum nitride powder, silicon nitride powder, copper powder, silver powder, diamond powder, nickel powder, zinc powder, stainless steel powder and carbon powder, but this list is not exhaustive. The particles may be spherical or irregular in shape. One may be used alone, or two or more may be used in admixture.

The catalyst selected from platinum and platinum compounds which is Component (E) promotes an addition reaction between the alkenyl groups of Component (A) and hydrogen atoms directly bonded to the silicon atoms of Component (B). Examples of this Component (E) are platinum, chloroplatinic acid, platinum-olefin complexes, platinum-alcohol complexes and platinum coordination compounds. If the blending proportion of the component (E) is less than 0.1 ppm relative to the weight of Component (A) as platinum atoms, it has no catalytic effect, and even if it is more than 500 ppm, no further increase of curing rate can be expected, so the range of 0.1–500 ppm is preferred.

The controlling agent which is Component (F) suppresses the hydrosilylation reaction at room temperature, and extends the shelf life and pot life. This controlling agent is appropriately selected from reaction controlling agents known in the art. Specific examples are acetylene compounds, nitrides, organophosphorus compounds, oximes and organic fluoro compounds, but this list is not exhaustive. If the blending proportion of Component (F) is less than 0.001 weight parts, sufficient shelf life and pot life are not obtained, whereas if it is more than 5 weight parts, curing properties decline, so a range of 0.001–5 weight parts is preferred. These compounds may also be diluted in an organic solvent such as toluene, xylene or isopropyl alcohol in order to improve dispersibility in silicone resin.

The organosilane represented by the general formula (1): $R^1{}_aR^2{}_b\mathrm{Si}(OR^3)_{4-a-b}$, which is Component (G)), may also be used as necessary in the composition of this invention in order to improve the wettability of the filler and silicone component. In the above general formula (1) for the organosilane (Component (G)) used to improve wettability, $R^1$ is an alkyl group having 6–15 carbon atoms, specific examples being hexyl, octyl, nonyl, decyl, dodecyl and tetradecyl. If the number of carbon atoms is less than 6, wettability with the filler is inadequate, and if it is more than 15, the organosilane solidifies at room temperature so that handling is difficult and the low temperature properties of the composition obtained decline. a is 1, 2 or 3, but 1 is particularly preferred. $R^2$ is a saturated or unsaturated monovalent hydrocarbon group having 1–8 carbon atoms, examples of this group being an alkyl group such as methyl, ethyl, propyl, hexyl or octyl; a cycloalkyl group such as cyclopentyl or cyclohexyl; an alkenyl group such as vinyl or allyl;

an aryl group such as phenyl or tolyl; an aralkyl group such as 2-phenylethyl or 2-methyl-2-phenylethyl; or a halogenated hydrocarbon group such as 3,3,3-trifluoropropyl, 2-(nanofluorobutyl)ethyl, 2-(heptadecafluorooctyl)ethyl or p-chlorophenol. In this invention, methyl or ethyl are preferred. $R^3$ is at least one type of alkyl group having 1–6 carbon atoms such as methyl, ethyl, propyl, butyl, pentyl or hexyl, but methyl and ethyl are particularly preferred.

Specific examples of the organosilane (Component (G)) represented by the aforesaid general formula are as follows.

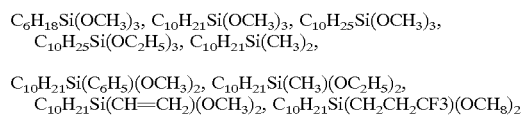

If the usage amount of this organosilane (Component (G)) is less than 0.01 weight parts relative to 100 weight parts of Component (A), the wettability of the filler and silicone component is poor, and if it is more than 10 weight parts, there is no enhanced effect which is uneconomical. Therefore, it is desirable that the range is 0.01–10 weight parts, and preferred that it is 0.1–7 weight parts.

In this composition, it is effective to remove the oxide film present on the surface of the metal filler component used, and add a flux component (H) to improve filler properties. This flux component (H) may be broadly divided into three types, i.e., inorganic, organic and resin. Examples of the inorganic type are inorganic acids such as orthophosphoric acid, hydrochloric acid, hydrobromic acid and hydrofluoric acid, and inorganic salts such as zinc chloride, stannous chloride, ammonium chloride, ammonium fluoride, sodium fluoride and zinc chloride/ammonium chloride=75/25. Examples of the organic type are organic acids such as formic acid, acetic acid, oleic acid, stearic acid, adipic acid, lactic acid and glutamic acid, organic acid salts such as ammonium formate and methylamine lactate, amines such as ethylene diamine, and amine halide acid salts such as methylamine hydrochloride, butylamine hydrobromide, ethylene diamine hydrochloride, triethanolamine hydrochloride and aniline hydrochloride. Examples of resins are rosin and active rosin. In particular, to enable the silicone composition to use addition reactions, it is preferred to use the organic acid type or resin type of flux. If the blending proportion of Component (H) is less than 0.05 weight parts relative to 100 weight parts of Component (A), the effect is weak, and if it is more than 20 weight parts, there is no increase of effect. It is therefore preferred that the range is 0.05–20 weight parts, and more preferred that it is 0.1–10 weight parts.

The silicone composition of the present invention may easily be manufactured by blending and kneading Components (A)–(F), and Component (G) and/or Component (H) if necessary, below the melting point of Component (C).

In this invention, in addition to the aforesaid Components (A)–(H), an adhesive adjunct for chemically bonding and fixing an IC package such as a CPU to a heat dissipating body such as a heat sink, may be introduced if necessary, and an antioxidant may further be added to prevent deterioration. The thermoconducting silicone composition of this invention may be prepared by mixing the aforesaid Components (A)–(F), and Component (G) and/or Component (H) if necessary, and stored as a one liquid-addition type for long periods of time at low temperature.

When the heat dissipating structure of the semiconductor device of this invention is assembled, a syringe is filled with the thermoconducting silicone composition of this invention, coated on the surface of an IC package such as a CPU, and then the heat dissipating body is fixed to the coated surface. Consequently, if the viscosity of the composition of this invention is lower than 10 Pa·s, the liquid drips during application, and if it is higher than 1,000 Pa·s, the coating efficiency falls. The viscosity must therefore lie in the range 10–1,000 Pa·s, but 50–400 Pa·s is particularly preferred.

The thermoconducting silicone composition of this invention is fixed and pressed between the IC package and the heat dissipating body by tightening the heat dissipating body and printed circuit board using a clamp or the like. In this process, if the thickness of the thermoconducting silicone composition sandwiched between the IC package and heat dissipating body is less than 10 micrometers, the ability to follow variations in the clamping pressure is inadequate, and a gap may be formed between the IC package and heat dissipating body. If it is more than 100 micrometers, its heat resistance increases due to its thickness and its heat dissipating effect is adversely affected. It is therefore preferred that its thickness is within the range 10–100 micrometers, and particularly preferred that it is 25–50 micrometers.

As described above, this silicone composition is cured by heating within a temperature range below the melting point of the Component (C) after dispensing. Further, if heat is transiently applied above the melting point of Component (C) after curing, Component (C) melts. Thus, parts of Component (C), or Component (C) and Component (D), or the IC package substrate surface and the heat dissipating body substrate surface, stick to each other. A continuous metal phase is thereby formed, so a higher heat dissipating effect is achieved. As the melted Component (C) is encapsulated inside the cured material, it does not flow out. This cured material is tacky, so it has a stable flexibility even if it is offset or left over time, and it does not peel away from the substrate. A sheet-like cured material of a predetermined thickness can also be manufactured by the above two-step heating process, and this material inserted between the IC package substrate and heat dissipating body substrate. In addition, the cured material can be appropriately used as a component in other devices which require thermoconductivity and heat resistance.

According to the present invention, the thermoconducting silicone composition interposed between an IC package and a heat dissipating body has a paste-like extensibility, so when the heat dissipating body is pressed onto it to fix it, even if there is unevenness on the surface of the IC package and heat dissipating body, these gaps can be evenly filled by pressing the thermoconducting silicone composition into them. Further, by transiently applying heat above the melting point of Component (C) after the silicone composition has been cured, an enhanced heat dissipating effect is ensured, and the overall reliability of electronic components is improved.

EXAMPLES

Hereafter, this invention will be described in more detail referring to specific examples, that it should be understood that the invention is not to be construed as being limited thereby.

First, the following components forming the composition of this invention were prepared.

Component (A):

Dimethylpolysiloxane (A-1) whereof both ends of the chain are terminated by methylvinylsilyl groups and the viscosity of 25° C. is 600 mm²/s Component (B):

Organohydrogenpolysiloxane (B-1) represented by the following structural

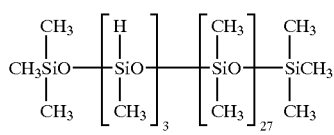

Component (C):

C-1: indium powder of average particle size of 18.4 micrometers (melting point 156.7° C.)

C-2: indium powder of average particle size of 47.6 micrometers (melting point 156.7° C.)

C-3: powdered alloy of tin (42 wt %)/bismuth (58 wt %) of average particle size of 26.9 micrometers (melting point 139° C.)

C-4: indium powder of average particle size of 110 micrometers (melting point 156.7° C.)

Component (D):

D-1: aluminum powder of average particle size 7.4 micrometers

D-2: zinc oxide powder of average particle size 1.0 micrometers

Component (E):

(A-1) solution of platinum-divinytetramethyldisiloxane complex containing 1 wt % as platinum atoms (E-1)

Component (F):

50 wt % toluene solution of 1-ethenyl-1-cyclohexanol (F-1)

Component (G):

Organosilane (G-1) represented by the formula $C_{10}H_{21}Si(OCH_3)_3$.

Component (H):

Rosin powder (H-1)

Examples 1–6

The thermoconducting silicone composition of this invention was prepared by adding Components (A), (C), (D), (G) in the blending proportions shown in Table 1 to a 5 liter gate mixer (Inoue Laboratories Ltd., 5 liter planetary mixer), mixing at 70° C. (below the melting point of Component (C)) for 1 hour, cooling to room temperature, adding Components (B), (E), (F), (H) in the blending proportions shown in Table 1, and mixing to render the mixture homogeneous. The viscosity of the composition obtained at 25° C. was measured using a Malcom viscosimeter (Malcom Ltd., PC-1T).

Next, the thermoconducting silicone composition was sandwiched between two standard aluminum plates, the silicone composition was cured at 120° C. for 1 hour while applying a pressure of approximately 1.80 kg/cm², and was then further heated at 170° C. for 15 minutes. After preparing a heat resistance measurement sample as described above, the thickness of each of the two standard plates was measured, and the thickness of the cured composition measured by subtracting the thickness of the standard aluminium plates which was already known. For the measurement of the aforesaid composition, a micrometer (Mitutoyo Ltd., M820-25VA) was used. The heat resistance of the final cured material was measured using a heat resistance gauge (Holometrix Micromet Microflash). These measurement results are shown in Table 1.

TABLE 1

| | Example | | | | | |
|---|---|---|---|---|---|---|
| | 1 | 2 | 3 | 4 | 5 | 6 |
| A-1 | 100 | 100 | 100 | 100 | 100 | 100 |
| B-1 | 11.7 | 11.7 | 11.7 | 23.4 | 35.1 | 11.7 |
| Si—H/Si-Vi (Number Ratio) | 1.0 | 1.0 | 1.0 | 2.0 | 3.0 | 1.0 |
| C-1 | 800 | 0 | 0 | 100 | 1000 | 800 |
| C-2 | 0 | 800 | 0 | 0 | 0 | 0 |
| C-3 | 0 | 0 | 800 | 0 | 0 | 0 |
| C-4 | 0 | 0 | 0 | 0 | 0 | 0 |
| D-1 | 400 | 400 | 400 | 800 | 200 | 500 |
| D-2 | 100 | 100 | 100 | 200 | 100 | 0 |

TABLE 1-continued

|  | Example | | | | | |
|---|---|---|---|---|---|---|
|  | 1 | 2 | 3 | 4 | 5 | 6 |
| E-1 | 0.15 | 0.15 | 0.15 | 0.15 | 0.15 | 0.15 |
| F-1 | 0.45 | 0.45 | 0.45 | 0.45 | 0.45 | 0.45 |
| G-1 | 6 | 6 | 6 | 3 | 6 | 6 |
| H-1 | 0 | 0 | 0.3 | 0 | 0 | 0 |
| C/(C + D) | 0.615 | 0.615 | 0.615 | 0.091 | 0.769 | 0.615 |
| Viscosity (Pa · s) | 100 | 180 | 130 | 90 | 80 | 120 |
| Heat Resistance (mm$^2$-K/W) | 7.4 | 8.4 | 9.0 | 11.3 | 6.3 | 8.0 |
| Thickness of Composition ($\mu$m) | 32 | 40 | 31 | 35 | 39 | 35 |

Comparative Examples 1–6

Cured materials were prepared in an identical manner to that of Examples 1–6, using the components in Table 2 instead of the components of Table 1. The results of measurement tests performed on the cured materials which were obtained in an identical manner to those of Examples 1–6, are shown in Table 2.

TABLE 2

|  | Comparative Example | | | | |
|---|---|---|---|---|---|
|  | 1 | 2 | 3 | 4 | 5 |
| A-1 | 100 | 100 | 100 | 100 | 100 |
| B-1 | 11.7 | 11.7 | 11.7 | 11.7 | 11.7 |
| Si—H/Si-Vi (Number Ratio) | 1.0 | 1.0 | 1.0 | 1.0 | 1.0 |
| C-1 | 50 | 300 | 0 | 1600 | 800 |
| C-2 | 0 | 0 | 0 | 0 | 0 |
| C-3 | 0 | 0 | 0 | 0 | 0 |
| C-4 | 0 | 0 | 800 | 0 | 0 |
| D-1 | 800 | 200 | 400 | 80 | 1200 |
| D-2 | 200 | 100 | 100 | 20 | 300 |
| E-1 | 0.15 | 0.15 | 0.15 | 0.15 | 0.15 |
| F-1 | 0.45 | 0.45 | 0.45 | 0.45 | 0.45 |
| G-1 | 6 | 6 | 6 | 6 | 6 |
| H-1 | 0 | 0 | 0 | 0 | 0 |
| C/(C + D) | 0.048 | 0.500 | 0.615 | 0.941 | 0.348 |
| Viscosity (Pa · s) | 170 | bad storage stability | 130 | bad storage stability | not grease like |
| Heat Resistance (mm$^2$-K/W) | 30.2 | — | 26.3 | — | — |
| Thickness of Composition ($\mu$m) | 30 | — | 73 | — | — |

The results of Table 1, Table 2 confirmed the effectiveness of the silicone composition of the present invention.

FIG. 1 is a transverse cross-sectional showing an example of a heat dissipating structure of a semiconductor device.

As shown in FIG. 1, the heat dissipating structure of the semiconductor device comprises a CPU2 mounted on a printed circuit board 3, and a thermoconducting silicone composition 1 on the CPU2 interposed between the CPU2 and a heat dissipating body 4. Herein, the heat dissipating body 4 is formed of aluminum, and it is provided with fins to obtain a large surface area and increase the heat dissipating effect. The heat dissipating body 4 and printed circuit 3 are tightened and fixed under pressure by a clamp 5.

0.2 g of the thermoconducting silicone compositions of Examples 1–6 and Comparative Examples 1 and 3 were sandwiched between the flat surface of a 2 cm×2 cm CPU and a heat dissipating body. The thickness of the thermoconducting silicone composition at this time was 30–40 micrometers.

When the heat dissipating device of an IC package having the aforesaid construction was applied to a CPU having a heat emission level of 100° C. used in host computers, personal computers and word processors, stable heat dissipation and diffusion were obtained, and performance decline or damage of the CPU due to heat build-up was prevented, only when the thermoconducting silicone composition of this invention was used.

What is claimed is:

1. A thermoconducting silicone composition comprising the following components (A)–(F), whereof the viscosity at 25° C. before curing is 10–1000 Pa·s:

Component (A): 100 weight parts of an organopolysiloxane having at least two alkenyl groups in the molecule, and a viscosity of 10–100,000 mm$^2$/s a 25° C., Component (B): An organohydrogenpolysiloxane having at least two hydrogen atoms bonded directly to silicon atoms in the molecule, in an amount such that (total number of hydrogen atoms bonded directly to silicon atoms/total number of alkenyl group in Component (A) is 0.5–5.0, Component (C): A low melting metal powder having a melting point of 40–250° C., and an average particle size of 0.1–100 micrometers, Component (D): A highly thermoconducting filler having a melting point of more than 250° C., and an average particle size of 0.1–100 micrometers, the total amount of component (C) and Component (D) being 800–2,200 weight parts, and (C)/((C)+(D))= 0.05–0.9, Component (E): A catalytic platinum selected from group comprising platinum and platinum compounds, 0.1–500 ppm relative to Component (A) calculated in terms of platinum atom, Component (F): 0.001–5 weight parts of a controlling agent which suppresses the catalytic activity of Component (E).

2. The thermoconducting silicone composition according to claim 1, further comprising 0.01–10 weight parts of an organosilane (Component (G)) represented by the following general formula (1) relative to 100 parts of Component (A):

$$R^1{}_aR^2{}_b Si(OR_3)_{4-a-b} \tag{1}$$

wherein $R^1$ is an alkyl group having 6–15 carbon atoms, $R^2$ is a monovalent hydrocarbon group having 1–8 carbon atoms, and $R^3$ is an alkyl group having 1–6 carbon atoms, these groups being identical or different, a is an integer in the range 1–3, b is an integer in the range 0–2, and a+b is an integer in the range 1–3.

3. The thermoconducting silicone composition according to claim 2, further comprising 0.05–20 weight parts of a flux (H) relative to 100 weight parts of Component (A).

4. A thermoconducting silicone composition according to claim 2, wherein the organosilane is of the formula:

$C_6H_{13}Si(OCH_3)_3$, $C_{10}H_{21}Si(OCH_3)_3$, $C_{10}H_{25}Si(OCH_3)_3$, $C_{10}H_{25}Si(OC_2H_5)_3$, $C_{10}H_{21}Si(C_6H_5)(OCH_3)_2$, $C_{10}H_{21}Si(CH_3)(OC_2H_5)_2$, $C_{10}H_{21}Si(CH=CH_2)(OCH_3)_2$, or $C_{10}H_{21}Si(CH_2CH_2CF_3)(OCH_3)_2$.

5. The thermoconducting silicone composition according to claim 1, formed by dispersion and mixing at a temperature below the melting point of Component (C).

6. A thermoconducting silicone curing product formed by heat curing the thermoconducting silicone composition of claim 1 at a temperature below the melting point of Component (C), and then heating to a temperature above the melting point of Component (C) to dissolve Component (C).

7. A method for installing the thermoconducting silicone composition of claim 1 between an IC package and a heat dissipating body, comprising the following steps 1, 2, 3, 4 in sequence:

Step 1: Coating a predetermined amount of the thermoconducting silicone composition on the IC package;

Step 2: Mounting a heat dissipating fin on the thermoconducting silicone composition, and fixing the fin;

Step 3: Curing the thermoconducting silicone composition at a temperature below the melting point of Component (C); and Step 4: Heating the curing product of the thermoconducting silicone composition at a temperature above the melting point of Component (C).

8. A heat dissipating structure of a semiconductor device comprising an IC package mounted on a printed circuit board, and a heat dissipating body installed on the surface of this IC package, wherein the curing product of the thermoconducting silicone composition of claim 1 is interposed between the surface of the IC package and the teat dissipating body.

9. A thermoconducting silicone composition according to claim 1, wherein the total number of hydrogen atoms bonded directly to silicon atoms/total number of alkenyl groups in component (A) is about 1.0–about 30.

10. A thermoconducting silicone composition according to claim 1, wherein the metal powder has a melting point of about 100–about 220° C.

11. A thermoconducting silicone composition according to claim 1, wherein the metal power has average particle size of about 20–about 50 micrometers.

12. A thermoconducting silicone composition according to claim 1, wherein the metal powder is indium, tin, a malott's metal alloy comprising bismuth, lead, tin or antimony, a ceromatrix alloy, a solder, a wood's metal or a cerolo alloy comprising tin, lead, bismuth, indium, cadmium, zinc, silver, or antimony, or an aluminium solder comprising aluminium, zinc, tin, lead or cadmium.

13. A thermoconducting silicone composition according to claim 1, wherein the filler has an average particle size of about 1–about 20 micrometers.

14. A thermoconducting silicone composition according to claim 1, wherein the proportion of the Component (C) contained in the total Components (C) and (D) is about 0.2–about 08.

15. A thermoconducting silicone composition according to claim 1, further comprising a flux component comprising an inorganic acid, an inorganic salt, an organic acid, an organic acid salt, an amine, an amine halide acid salt, or a resin.

16. A thermoconducting silicone composition according to claim 15, wherein the flux component is blended and kneaded below the melting point of Component (C).

* * * * *